United States Patent [19]

Saito

[11] Patent Number: 5,717,361
[45] Date of Patent: Feb. 10, 1998

[54] DC FEEDBACK COMMON EMITTER TYPE AMPLIFIER CIRCUIT HAVING STABLE GAIN IRRESPECTIVE OF POWER SUPPLY VOLTAGE

[75] Inventor: Akihiro Saito, Yamagata, Japan

[73] Assignee: NEC Corporation, Tokyo, Japan

[21] Appl. No.: 638,212

[22] Filed: Apr. 26, 1996

[30] Foreign Application Priority Data

Apr. 27, 1995 [JP] Japan ............... 7-103739

[51] Int. Cl.⁶ .................... H03F 1/30; G11B 5/02
[52] U.S. Cl. ........................ 330/290; 360/67
[58] Field of Search ................. 330/85, 288, 290, 330/296, 311; 360/67, 68

[56] References Cited

U.S. PATENT DOCUMENTS 3,825,850  7/1974  Meri ..................... 330/290
5,124,667  6/1992  Chevallier ............ 330/290 X
5,548,453  8/1996  Sasaki et al. ........ 360/67

FOREIGN PATENT DOCUMENTS 63-81604  4/1988  Japan.
4-347913  12/1992  Japan.

*Primary Examiner*—Steven Mottola
*Attorney, Agent, or Firm*—Whitham, Curtis, Whitham & McGinn

[57] ABSTRACT

In a common emitter type amplifier circuit including an input bipolar transistor having an emitter connected to a ground terminal and a collector connected to a load connected to a power supply terminal, a voltage at the collector of the bipolar transistor is fixed by a DC feedback loop, and a current control circuit is provided between the collector of the bipolar transistor and the ground terminal. Thus, a current in proportion to a voltage at the power supply terminal flows from the load to the ground terminal.

8 Claims, 8 Drawing Sheets

DC FEEDBACK COMMON EMITTER TYPE AMPLIFIER CIRCUIT HAVING STABLE GAIN IRRESPECTIVE OF POWER SUPPLY VOLTAGE

BACKGROUND OF THE INVENTION

1. Field of the Invention

The present invention relates to a common emitter type amplifier circuit, and more particularly, to a common emitter type amplifier circuit with a DC feedback loop having a stable gain irrespective of a power supply voltage.

2. Description of the Related Art

In a magnetic recording apparatus such as a video tape recorder, in order to reduce noise, a pre-amplifier of a regeneration circuit for amplifying a regeneration signal from a head has been constructed by a common emitter type amplifier circuit. However, a prior art common emitter type amplifier circuit has an unstable gain dependent upon a power supply voltage, which will be explained later in detail.

SUMMARY OF THE INVENTION

It is an object of the present invention to provide a common emitter type amplifier circuit having a stable gain irrespective of a power supply voltage.

According to the present invention, in a common emitter type amplifier circuit including an input bipolar transistor having an emitter connected to a ground terminal and a collector connected to a load connected to a power supply terminal, a voltage at the collector of the bipolar transistor is fixed by a DC feedback loop, and a collector current control circuit is provided between the collector of the bipolar transistor and the ground terminal. Thus, a current in proportion to a voltage at the power supply terminal flows from the load to the ground terminal.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENT

Before the description of the preferred embodiment, a prior art common emitter type amplifier circuit will be explained with reference to FIGS. 1, 2 and 3.

Figure 1:
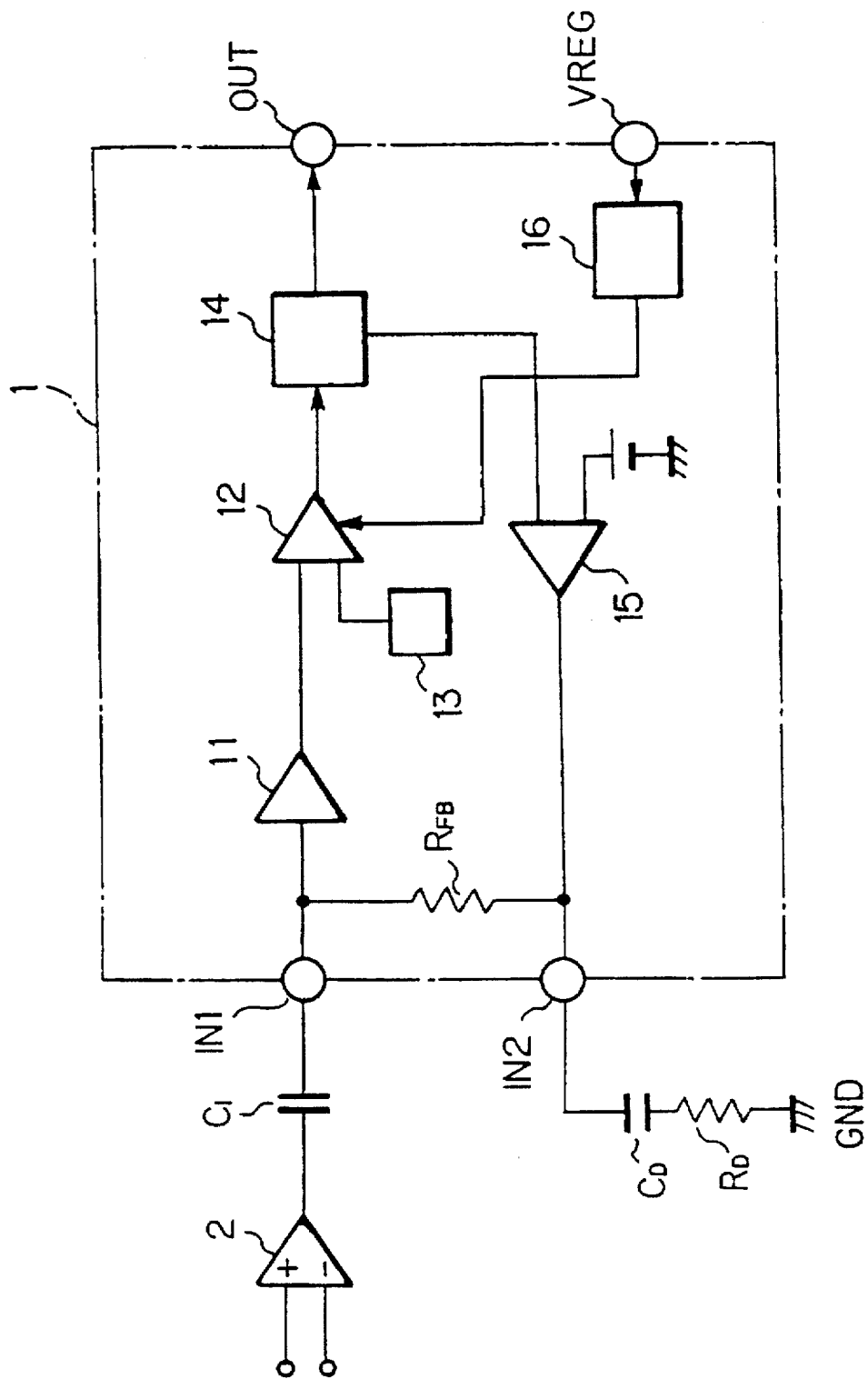
FIG. 1 is a circuit diagram illustrating a signal regeneration circuit of a video tape recorder including a prior art common emitter type amplifier circuit.

In FIG. 1, which illustrates a signal regeneration circuit including a prior art common emitter type amplifier circuit, reference numeral 1 designates a signal regeneration circuit having two input terminals IN1 and IN2, an output terminal OUT and a regulation voltage terminal VREG.

An output of a head 2 is supplied via a DC blocking capacitor $C_1$, to the input terminal IN1 of the signal regeneration circuit 1. Also, an external damping capacitor $C_D$ and an external damping resistor $R_D$ are connected in series between the input terminal IN2 of the signal regeneration circuit 1 and a ground terminal GND. The values of the damping capacitor $C_D$ and the damping resistor $R_D$ are changed to adjust a damping amount.

The signal regeneration circuit 1 includes a first stage amplifier 11 of a common emitter type, and a second stage amplifier 12 constructed by a differential amplifier. The second stage amplifier 12 amplifies a difference in potential between the output of the first stage amplifier 11 and the output of a bias voltage generating circuit 13, and the output of the second stage amplifier 12 is supplied via an output circuit 14 to the output terminal OUT.

Also, in order to reduce a DC Offset, a DC feedback loop formed by a feedback circuit 15 and a feedback resistor $R_{FB}$ is provided between the output circuit 14 and the input terminal IN1.

Also, reference numeral 16 designates a bias voltage generating circuit for generating a constant voltage and supplying it to the second stage amplifier 12 and the output circuit 14. Thus, current values of constant current sources in the second stage amplifier 12 and the output circuit 14 can be adjusted.

The signal regeneration circuit 1 of FIG. 1 is explained next in detail with reference to FIG. 2.

The first stage amplifier 11 is constructed by s transistor $Q_1$ having a base connected to the input terminal IN1 and a load resistor $R_1$ connected in series between the ground terminal GND and a power supply terminal $V_{cc}$ whose voltage is 5V, for example. Note that a transistor $Q_2$, which is not shown in FIG. 1, is connected between the collector of the transistor $Q_1$ and the resistor $R_1$, to thereby reduce the noise. However, the transistor $Q_2$ can be deleted.

The signal at the input terminal IN1 is amplified by the first stage amplifier 11, and is supplied via an emitter follower formed by a transistor $Q_3$ and a resistor $R_3$ to the second stage amplifier 12. Note that this emitter follower is not shown in FIG. 1.

The second stage amplifier 12 constructed by two transistors $Q_4$ and $Q_5$ forming a differential pair, a resistor $R_3$, a load resistor $R_4$, and constant current sources formed by transistors $Q_6$ and $Q_7$ and resistors $R_5$ and $R_6$.

The bias voltage generating circuit 13 is constructed by diode-connected transistor $Q_8$, $Q_9$ and $Q_{10}$, and a load resistor $R_7$. A voltage generated by the bias voltage generating circuit 13 is applied via an emitter follower formed by a transistor $Q_{11}$ and a resistor $R_8$ to the base of the transistor $Q_5$ of the second stage amplifier 12. Note that this emitter follower is not shown in FIG. 1.

A difference in potential between the output of the first stage amplifier 11 and the output of the bias voltage generating circuit 13, precisely, a difference in potential between the emitter follower ($Q_3$, $R_2$) and the emitter follower ($Q_{11}$, $R_8$), is amplified and transmitted to the output circuit 14.

The output circuit 14 includes a first stage emitter follower formed by a transistor $Q_{12}$ and a constant current source ($Q_{13}$, $R_9$), and a second stage emitter follower formed by a transistor $Q_{14}$ and a constant current source ($Q_{15}$, $R_{10}$). The first stage emitter follower is connected to the output terminal OUT. On the other hand, the DC feedback loop (15, $R_{FB}$) is connected to the second stage emitter follower.

The bases of the transistors $Q_6$, $Q_7$, $Q_{13}$ and $Q_{15}$ of the constant current sources are controlled by the bias voltage generating circuit 16.

Figure 2:
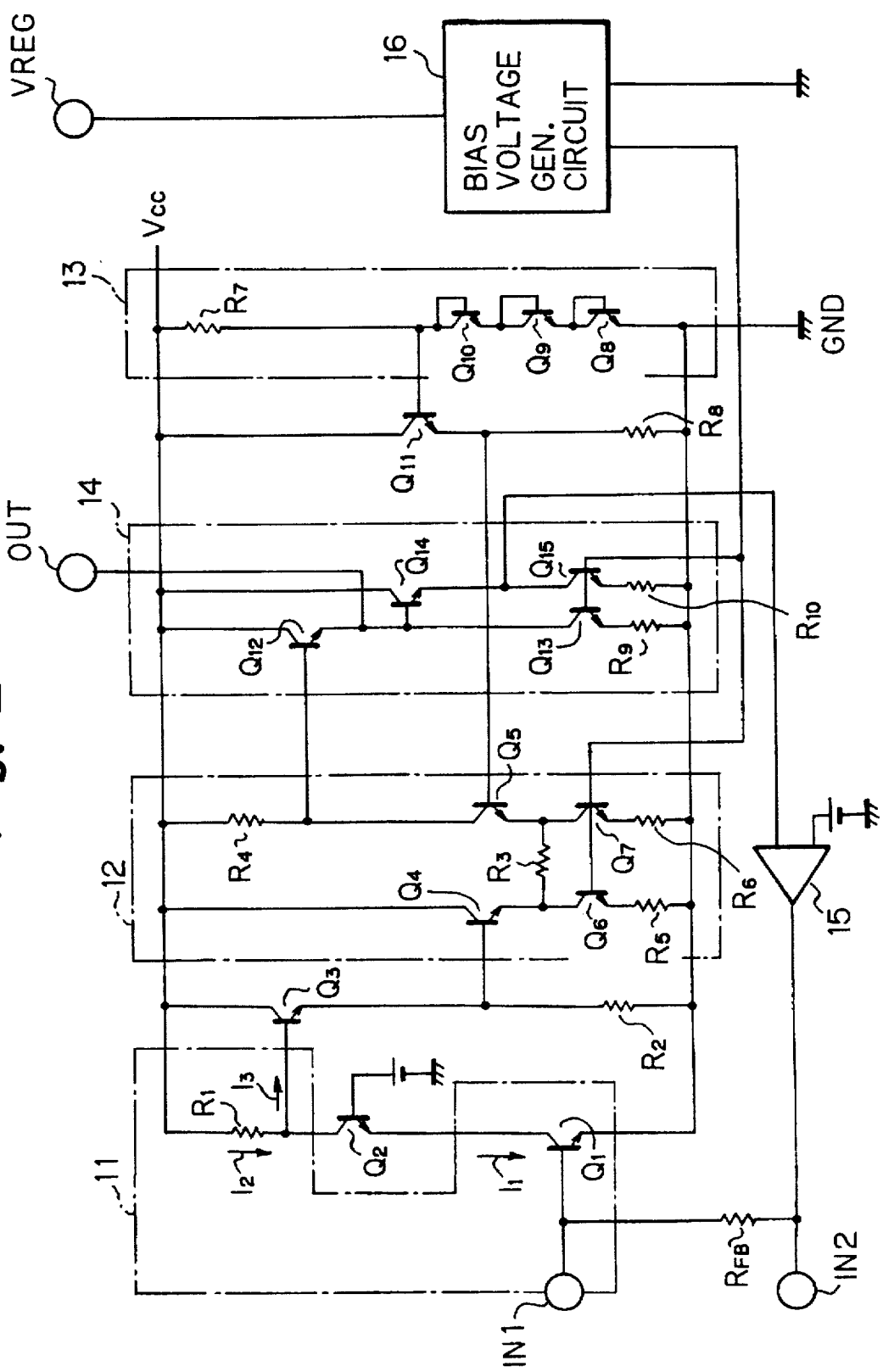
FIG. 2 is a partially detailed circuit diagram of the signal regeneration circuit of FIG. 1.
Figure 3:
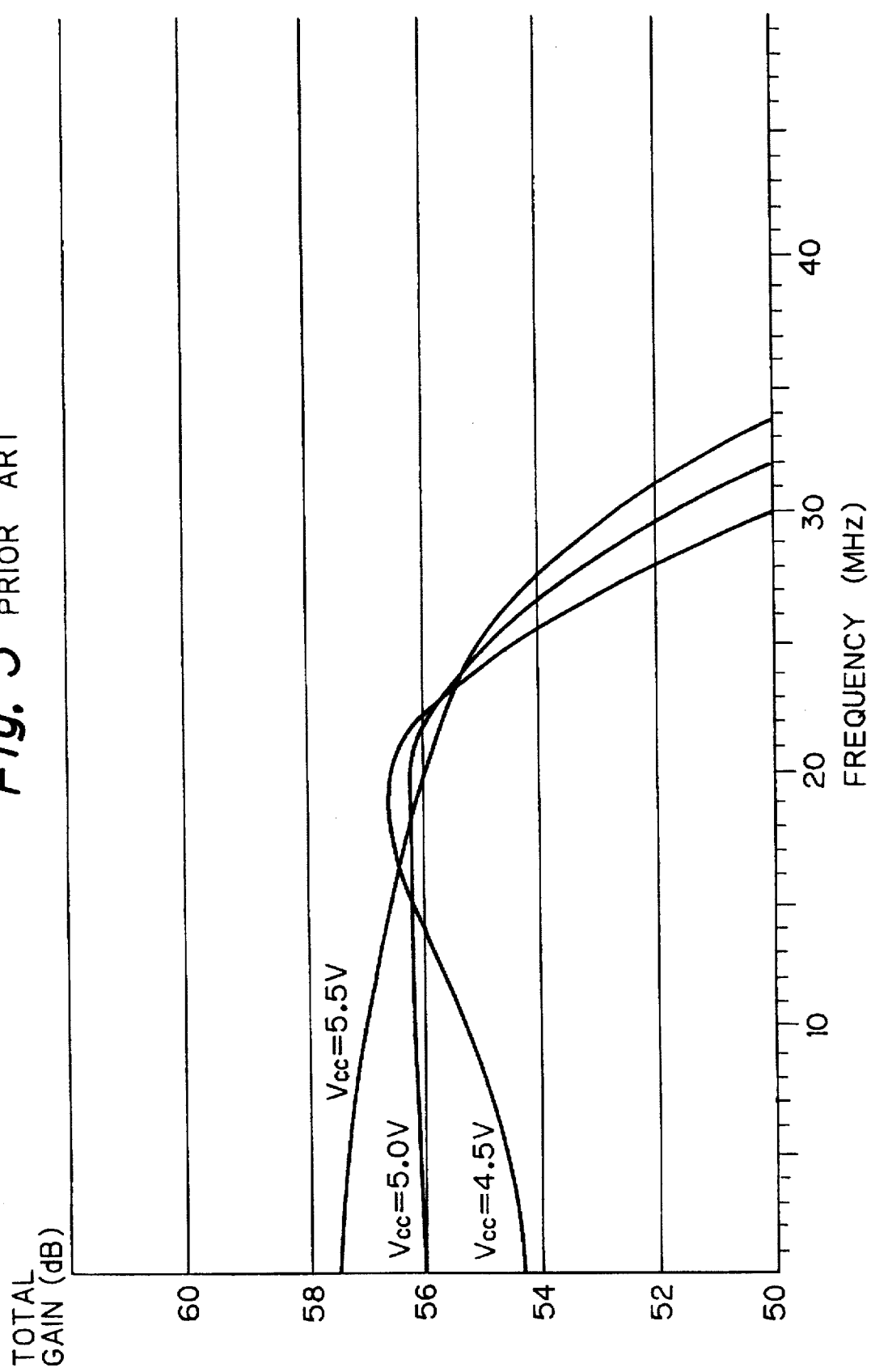
FIG. 3 is a graph showing the frequency-to-total gain characteristics of the signal regeneration circuit of FIG. 2.

In FIG. 2, if the current amplification of the transistors is very large, the gain $G_v$ of the first stage amplifier 11 is represented by $$G_v \approx R_1/r_e \quad (1)$$

where $R_1$ is also a resistance value of the resistor $R_1$, and $r_e$ is an emitter resistance of the transistor $Q_1$. Also, the emitter resistance $r_e$ is represented by $$r_e = (kT/q)/I_E \quad (2)$$

where k is a Boltzmann constant;
T is the absolute temperature; and
$I_E$ is an emitter current of the transistor $Q_1$.
Therefore, from the formulae (1) and (2), $$G_v \approx (q/kT) \cdot R_1 \cdot I_E \quad (3)$$

Now, consider that the emitter current $I_E$ of the transistor $Q_1$ is approximately the same as the collector current $I_1$ thereof, and the collector current $I_1$ is approximately the same as a current $I_2$ flowing through the resistor $R_1$. Then, the formula (3) is replaced by $$\begin{aligned} G_v &\approx (q/kT) \cdot R_1 \cdot I_1 \quad (4) \\ &\approx (q/kT) \cdot R_1 \cdot I_2 \\ &= (q/kT) \cdot (V_{CC} - V_{BB}(Q_3)) \end{aligned}$$

where $V_{BE}$ ($Q_3$) is a base voltage of the transistor $Q_3$. On the other hand, the base voltage $V_{BE}$ ($Q_3$) is represented by $$\begin{aligned} V_{BB}(Q_3) &= V_{BE}(Q_4) + V_{BE} \quad (5) \\ &= V_{BE}(Q_5) + V_{BE} \\ &= V_{BE}(Q_{11}) \\ &= 3V_{BE} \end{aligned}$$

where $V_{BE}$ ($Q_4$), $V_{BE}$ ($Q_5$) and $V_{BE}$ ($Q_{11}$) are base voltages of the transistors $Q_4$, $Q_5$ and $Q_{11}$, respectively, and $V_{BE}$ is a base-to-emitter voltage of the transistors. Therefore, from the formulae (4) and (5), $$G_v \approx (q/kT)(V_{cc} - 3V_{BE}) \quad (6)$$

Since the value $3V_{BE}$ determined by the three diode-connected transistors $Q_8$, $Q_9$ and $Q_{10}$ is constant irrespective of the power supply voltage $V_{cc}$, the gain $G_v$ is greatly subject to the change of the power supply voltage $V_{cc}$.

Also, a feedback amount FB in the signal regeneration circuit 1 provided by the DC feedback loop is represented by $$FB = G_v j\omega/(R_{FB} + j\omega L) \quad (7)$$

where $R_{FB}$ is also a resistance value of the resistor $R_{FB}$; and L is an inductance of the head 2. Therefore, the total gain fluctuates, and as a result, the frequency characteristics and the transfer characteristics Q around the resonance oscillation frequency fluctuate greatly. Thus, a correct regeneration signal cannot be obtained, that is, an error rate is increased. As shown in FIG. 3, which shows an example of the frequency-to-total gain characteristics of the signal regeneration circuit 1 of FIG. 2, a maximum fluctuation of the total gain is about 3 dB within a range of $V_{cc} = 4.5$ to $V_{cc} = 5.5V$.

Figure 4:
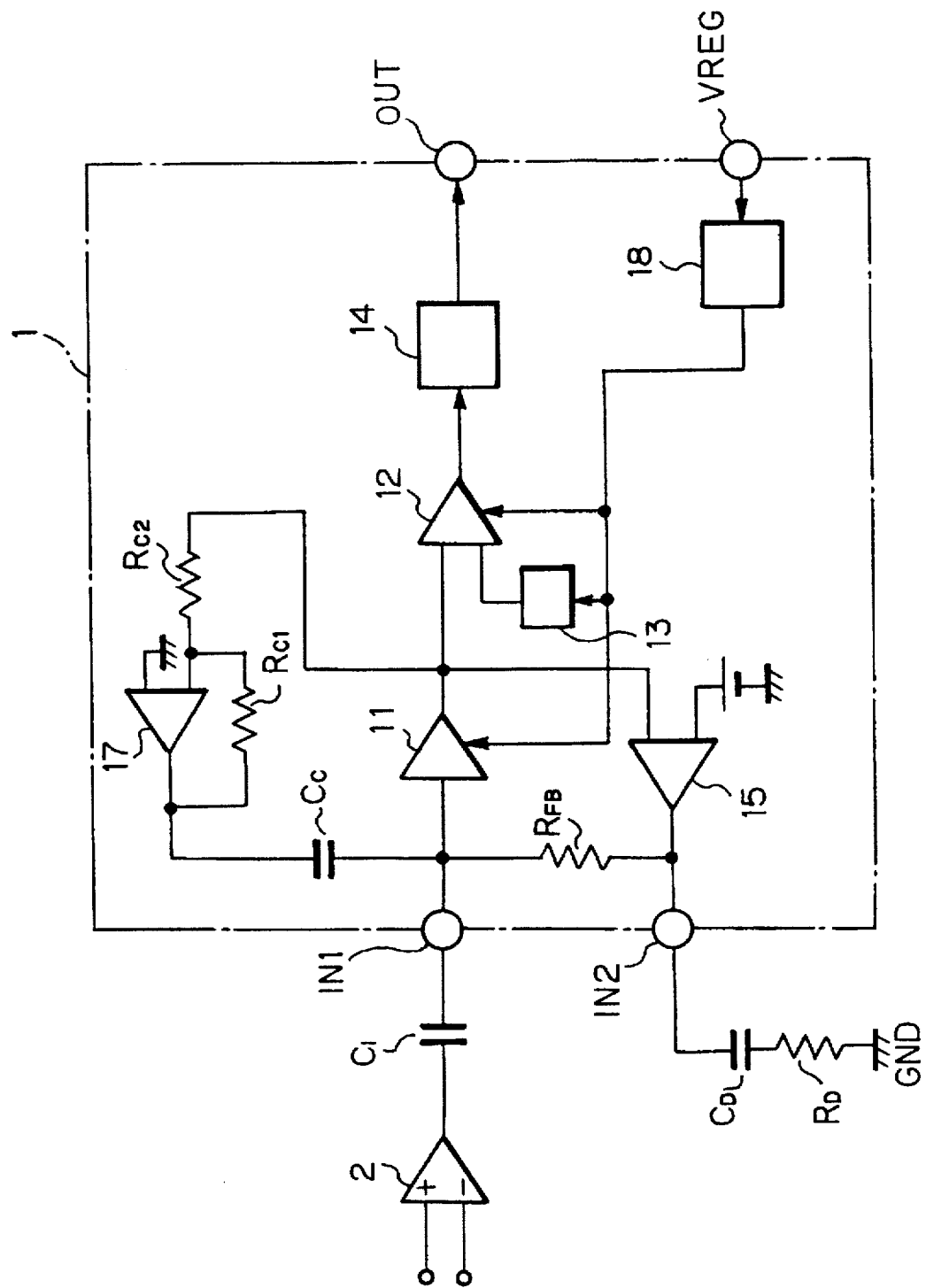
FIG. 4 is a circuit diagram illustrating a signal regeneration circuit of a video tape recorder including an embodiment of the common emitter type amplifier circuit according to the present invention.

In FIG. 4, which illustrates a signal regeneration circuit including an embodiment of the common emitter type amplifier circuit according to the present invention, an AC feedback loop formed by a feedback circuit 17, resistors $R_{c1}$ and $R_{c2}$, and a capacitor $C_c$ is connected between the output and input of the first stage amplifier 11, to increase the resonance frequency. The AC feedback amount is controlled by changing the value of the resistors $R_{c1}$ and $R_{c2}$. Also, in this case, the DC feedback loop (15, $R_{FB}$) is connected between the output and input of the first stage amplifier 11.

Figure 5:
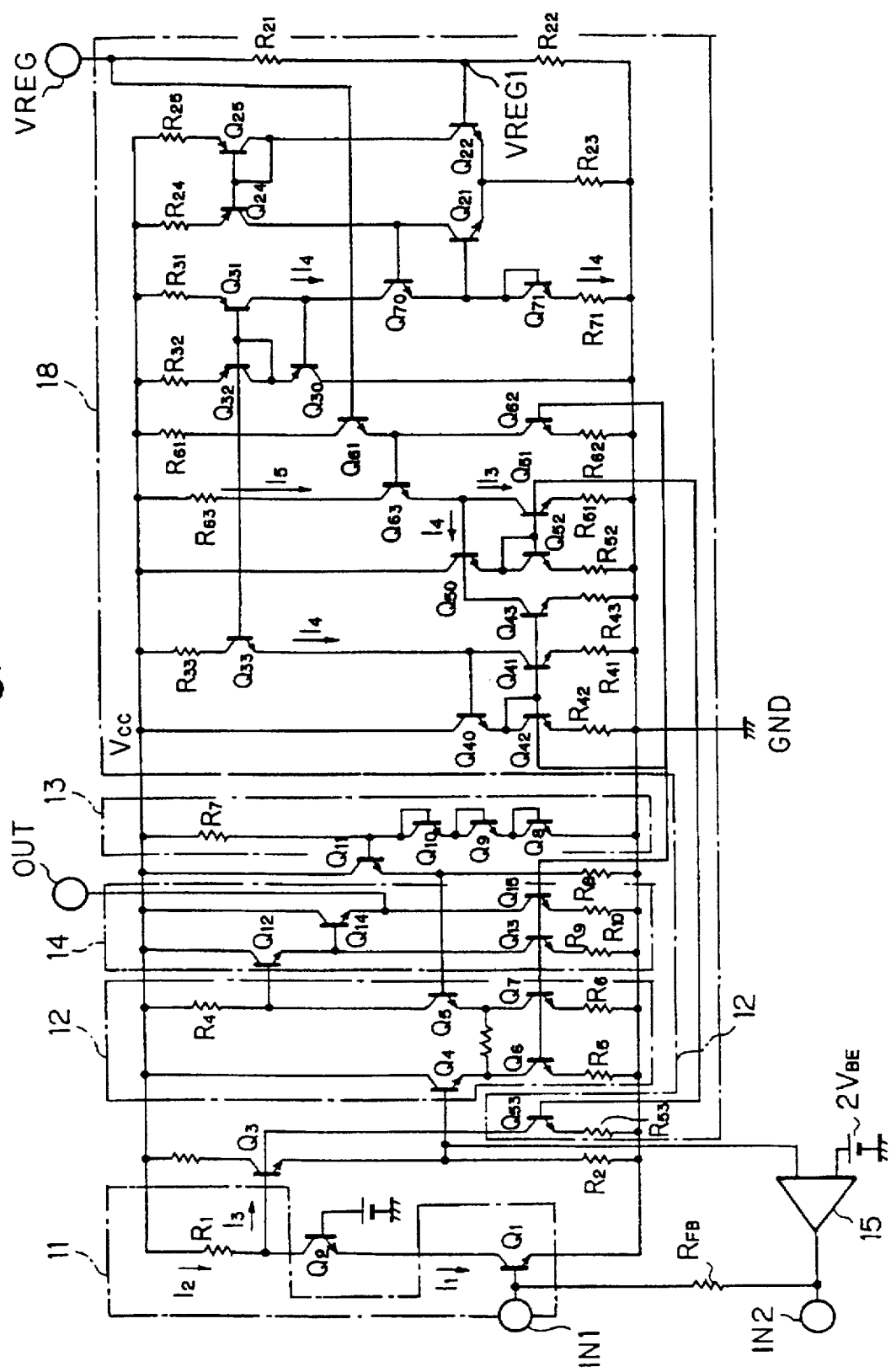
FIG. 5 is a partially detailed circuit diagram of the signal regeneration circuit of FIG. 4.

The first stage amplifier 11, the second stage amplifier 12 and the bias voltage generating circuit are controlled by a regulation circuit 18 which is illustrated in detail in FIG. 5.

Referring to FIG. 5, two resistors $R_{21}$ and $R_{22}$ form a voltage divider for the reference voltage which is constant irrespective of the power supply voltage $V_{cc}$.

A differential pair formed by transistors $Q_{21}$ and $Q_{22}$, a current mirror circuit formed by transistors $Q_{24}$ and $Q_{25}$ and resistors $R_{23}$, $R_{24}$ and $R_{25}$ form a differential amplifier.

A current mirror circuit is constructed by a transistor $Q_{31}$ for an input side, transistors $Q_{30}$, $Q_{32}$ and $Q_{33}$ for an output side, and resistors $R_{31}$, $R_{32}$ and $R_{33}$.

A current mirror circuit is constructed by a transistor $Q_{41}$ for an input side, transistors $Q_{40}$, $Q_{42}$ and $Q_{43}$ for an output side, and resistors $R_{41}$, $R_{42}$ and $R_{43}$.

A current mirror circuit is constructed by a transistor $Q_{51}$ for an input side, transistors $Q_{50}$, $Q_{52}$ and $Q_{53}$ for an output side, and resistors $R_{51}$, $R_{52}$ and $R_{53}$. In this case, the transistor $Q_{53}$ and the resistor $R_{53}$ are connected between the resistor $R_1$ of the first stage amplifier 11 and the ground terminal GND.

Also, a resistor $R_{61}$, transistors $Q_{61}$ and $Q_{62}$, and a resistor $R_{62}$ form an emitter follower, and also, a resistor $R_{63}$ and a transistor $Q_{63}$ form an emitter follower.

Also, transistors $Q_{70}$, $Q_{71}$ and a resistor $R_{71}$ with the transistor $Q_{31}$ and the resistor $R_{31}$ define a current flowing through the current mirror circuit ($Q_{30}$, $Q_{31}$, $Q_{32}$, $Q_{33}$).

The regulation circuit 18 controls the collector current of the transistor $Q_{53}$ to control the base current $I_3$ of the transistor $Q_3$, thus absorbing fluctuation of the collector current $I_1$ of the transistor $Q_1$ due to the fluctuation of the power supply voltage $V_{cc}$. In this case, the regulation circuit 18 is operated in accordance with the regulation voltage VREG.

In FIG. 5, from the formula (4), the gain $G_v$ of the first stage amplifier 11 is represented by $$G_v \approx (q/kT) \cdot R_1 \cdot I_1 \quad (8)$$

Here, since the base current $I_3$ of the transistor $Q_3$ is changed by the regulation circuit 18, the difference between the collector current $I_1$ of the transistor $Q_1$ and the current flowing through the resistor $R_1$ may be relatively large. In this case, $$I_1 = I_2 - I_3$$

$$I_2 = (V_{cc} - V_{BB}(Q_3))/R_1$$

Therefore, the formula (8) is replaced by $$\begin{aligned} G_v &\approx (q/kT) \cdot R_1 \cdot [\{(V_{CC} - V_{BB}(Q_3))/R_1 - I_3\}] \quad (9) \\ &= (q/kT) \cdot \{(V_{CC} - V_{BE}(Q_3)) - R_1 \cdot I_3\} \end{aligned}$$

On the other hand, assume that the same voltage $2V_{BE}$ as the base voltage of the transistor $Q_{11}$ is applied to an input of the feedback circuit 15, and therefore, the base voltage of the transistor $Q_3$ is the same as the base voltage ($3V_{BE}$) of the transistor $Q_{11}$. Therefore, the formula (9) is replaced by $$G_v=(q/kT)\cdot\{(V_{cc}-3V_{BE})-R_1 I_3\} \quad (10)$$

Since the transistors $Q_{51}$ and $Q_{53}$ form the current mirror circuit, a current flowing through the transistor $Q_{51}$ is $I_3$. Therefore, if a current flowing through the transistor $Q_{43}$ is denoted by $I_4$ and a current flowing through the transistor $Q_{63}$ is denoted by $I_5$, $$I_5=I_3+I_4 \text{ then, } I_3=I_5-I_4 \quad (11)$$

The current $I_5$ is discussed below. The current is represented by $$I_5=(V_{cc}-V_{cc}(Q_{63}))/R_{63} \quad (12)$$

where $V_{cc}$ ($Q_{63}$) is a collector voltage of the transistor $Q_{63}$, and $R_{63}$ also is a resistance value of the resistor $R_{63}$. In this case, $$\begin{aligned}V_{CC}(Q_{63}) &= V_{BB}(Q_{63}) + V_{BE}\\&= V_{BE}(Q_{61}) + V_{BE}\\&= V_{BB}(Q_{61})\\&= VREG\end{aligned}$$

Therefore, the formula (12) is replaced by $$I_5=(V_{cc}-VREG)/R_{63} \quad (13)$$

The current $I_4$ is discussed below. Since the transistors $Q_{43}$ and $Q_{41}$ form the current mirror circuit, a current flowing through the transistor $Q_{41}$ is $I_4$, and accordingly, a current flowing through the transistor $Q_{33}$ is $I_4$. Also, since the transistors $Q_{33}$ and $Q_{31}$ form the current mirror circuit, a current flowing through the transistor $Q_{32}$ is also $I_4$. Therefore, the current $I_4$ is represented by $$\begin{aligned}V_{EE}(Q_{71}) &= V_{BE}(Q_{71})/R_{71}\\&= V_{BB}(Q_{21}) - V_{BE}\\&= (V_{EE}(Q_{21}) + V_{BE}) - V_{BE}\\&= (V_{EE}(Q_{22}) + V_{BE}) - V_{BE}\\&= V_{BB}(Q_{22}) - V_{BE}\\&= \{R_{22}/(R_{21}+R_{22})\}\cdot VREG - V_{BE}\end{aligned}$$

Therefore, $$I_4=(VREG1-V_{BE})/R_{71} \quad (14)$$

where VREG1=VREG·$R_{22}$/($R_{21}+R_{22}$)
From the formulae (11),(13) and (14), $$I_3=(V_{cc}-VREG)/R_{63}-(VREG1-V_{BE})/R_{71} \quad (15)$$

Therefore, the formula (9) is replaced by $$G_v=(q/kT)[(V_{cc}-3V_{BE})-R_1(V_{cc}-VREG)/R_{63}-(VREG1-V_{BE})/R_{71}] \quad (16)$$

Thus, if $R_1=R_{63}$, $$G_v=(g/kT)[(VREF-3V_{BE})-(VREG1-V_{BE})/R_{71}] \quad (17)$$

Figure 6:
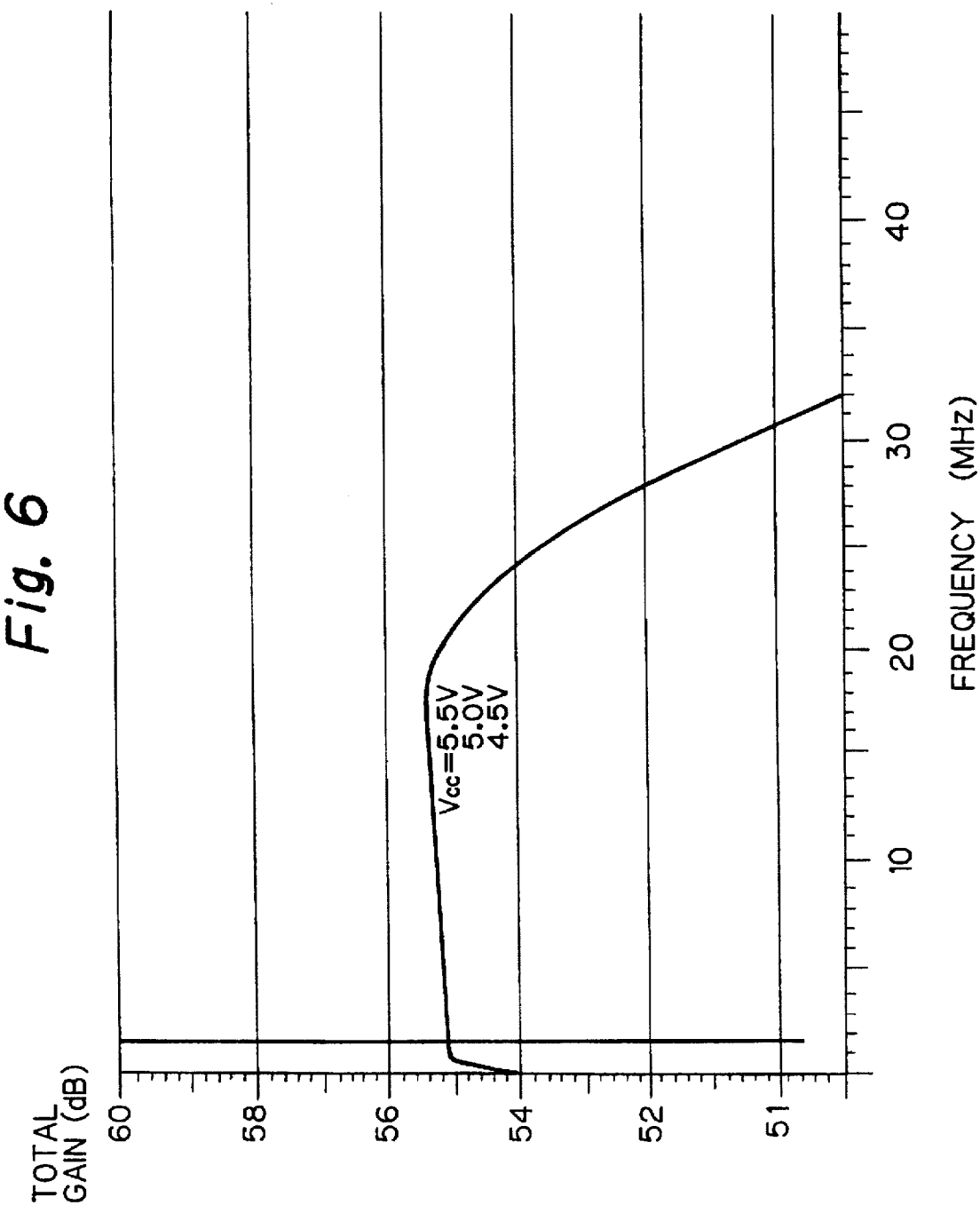
FIG. 6 is a graph showing the frequency-to-total gain characteristics of the signal regeneration circuit of FIG. 5.

Therefore, it is possible for the gain $G_v$ of the first stage amplifier 11 not to be subject to the power supply voltage $V_{cc}$, and therefore, the feedback amount FB represented by the formula (7) becomes stable. As a result, the total again hardly fluctuates, and also as a result, the frequency characteristics and the transfer characteristics Q hardly fluctuate. Thus, a correct regeneration signal can be obtained, that is, an error rate is decreased. As shown in FIG. 6, which shows an example of the frequency-to-total gain characteristics of the signal regeneration circuit 1 of FIG. 5, a maximum fluctuation of the total gain is about 0 within a range of $V_{cc}$=4.5 to $V_{cc}$=5.5V.

Figure 7:
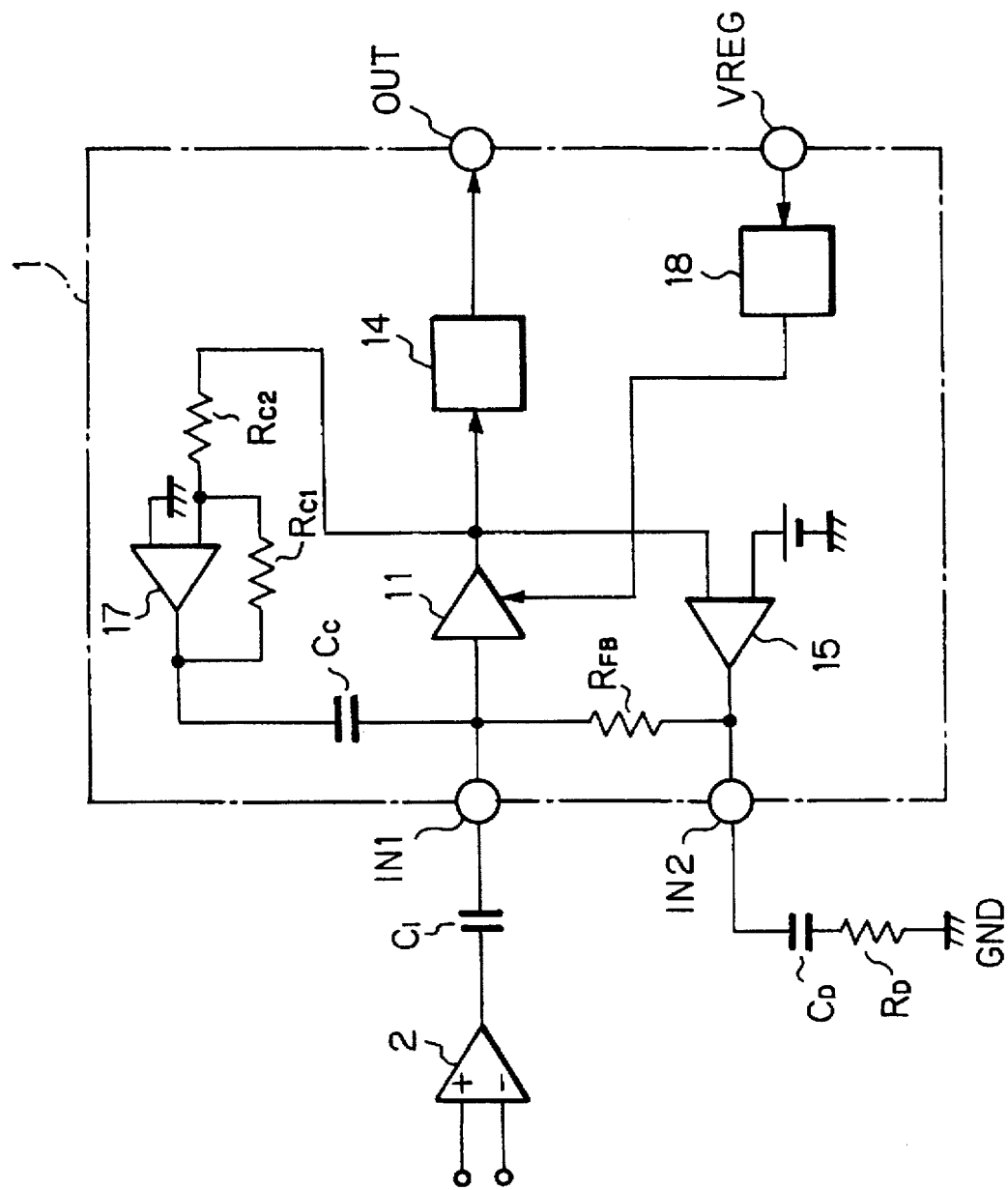
FIGS. 7 and 8 are circuit diagrams illustrating modifications of the signal regeneration circuit of FIG. 4.

In FIGS. 4 and 5, although the two amplifiers 11 and 12 are provided, the present invention can be applied to a circuit as illustrated in FIG. 7 where the second stage amplifier 12 as well as the bias voltage generating circuit 13 is not provided.

Figure 8:
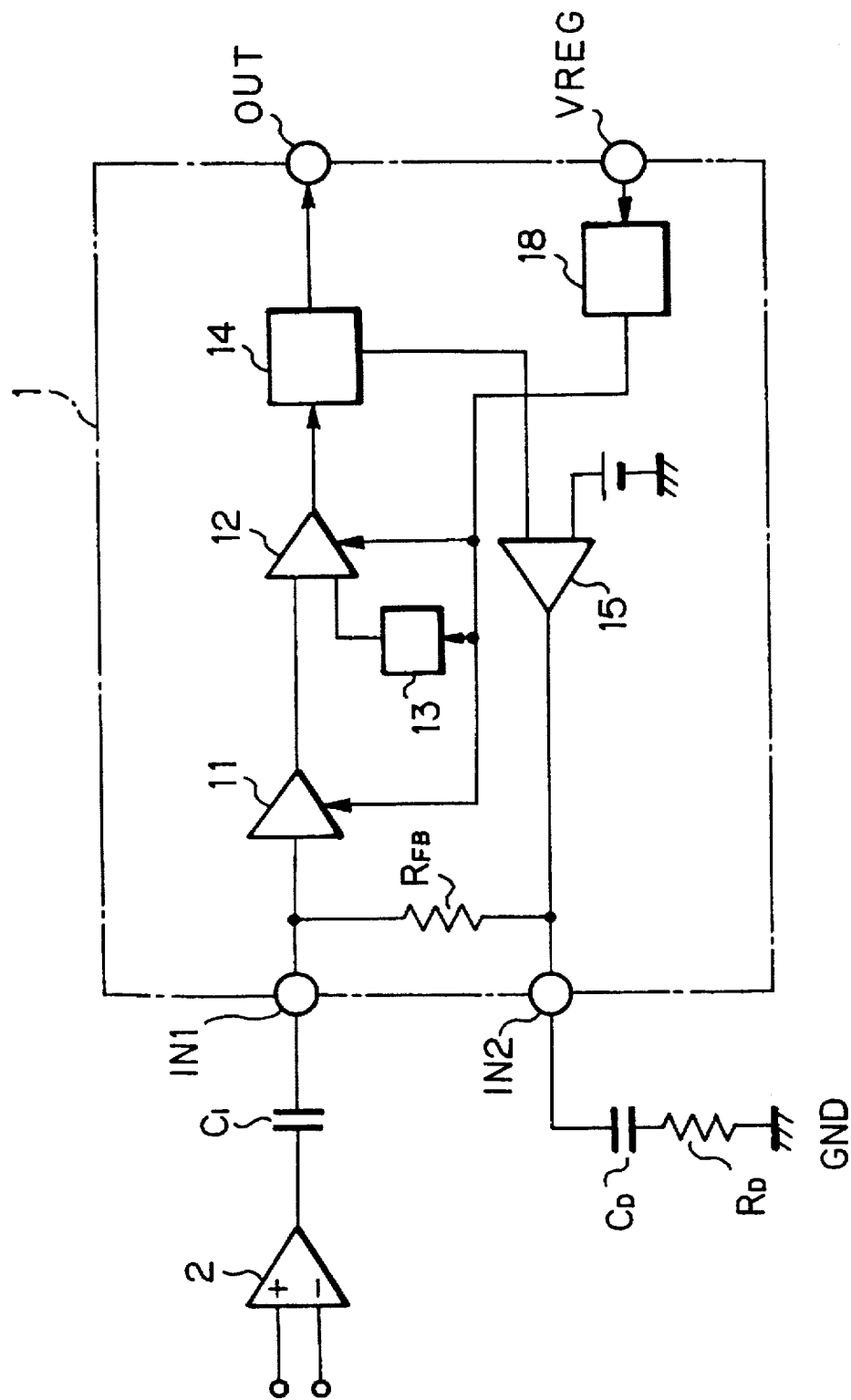

Also, in FIGS. 4 and 5, the DC feedback loop is connected between the output and input of the first stage amplifier 11. However, if the AC feedback loop is not provided, the DC feedback loop is connected between the output circuit 14 and the input of the first stage amplifier 11 as illustrated in FIG. 8.

Further, in the above-described embodiment, all the emitter areas of the transistors forming the current mirror circuits are the same. However, these emitter areas can be changed; in this case, the ratio of the resistance values of the resistors $R_1$ and $R_{63}$ can be changed.

As explained hereinbefore, according to the present invention, a common emitter type amplifier having a stable gain irrespective of a power supply voltage can be obtained.

I claim:

1. A common emitter type amplifier circuit, comprising:
   first and second power supply terminals;
   an input terminal;
   a first transistor having a base connected to said input terminal, an emitter connected to said first power supply terminal, and a collector;
   a first load connected between the collector of said first transistor and said second power supply terminal;
   direct current (DC) feedback loop means connected between said first load and said input terminal; and
   a collector current control circuit, connected between said first load and said first power supply terminal, for flowing a current between said first load and said first power supply terminal, said current being proportional to a voltage at said second power supply terminal.

2. The common emitter type amplifier circuit as set forth in claim 1, wherein said collector current control circuit comprises:
   a first current generating circuit for generating a first current in proportion to a regulation voltage independent of the voltage at said second power supply terminal;
   a second current generating circuit for generating a second current in proportion to a difference between said regulation voltage and the voltage at said second power supply terminal; and
   a third current generating circuit, connected to said first and second current generating circuits, for generating a difference current between said second current and said first current, said difference current flowing between said first load and said first power supply terminal.

3. The common emitter type amplifier circuit as set forth in claim 2, wherein said first current generating circuit comprises a first current mirror circuit having a first input transistor for receiving a divided voltage of said regulation voltage and a first output transistor,
   said second current generating circuit comprising:
   a second load connected to said second power supply terminal; and
   a second transistor connected to said second load and having a base for receiving a voltage equivalent to said regulation voltage, said third current generating circuit comprising:

a second current mirror circuit having a second input transistor connected to said first output transistor and a second output transistor connected to said second transistor; and a third current mirror circuit having a third input transistor connected to said second transistor and a third output transistor connected to said second load.

4. The common emitter type amplifier circuit as set forth in claim 3, wherein said input transistor and said output transistor of said first current mirror circuit, said input transistor and said output transistor of said second current mirror circuit, and said input transistor and said output transistor of said third current mirror circuit have a common sitter area, and said first and second loads have a common resistance value.

5. The common emitter type amplifier circuit as set forth in claim 1, further comprising alternating current (AC) feedback loop means connected between said first load and said input terminal.

6. The common emitter type amplifier circuit as set forth in claim 1, further comprising a differential type amplifier connected to said first load.

7. The common emitter type amplifier circuit as set forth in claim 6, wherein said DC feedback loop means is connected to an output of said differential type amplifier.

8. A common emitter type amplifier circuit, comprising:

first and second power supply terminals;

an input terminal;

a first transistor having a base connected to said input terminal, an emitter connected to said first power supply terminal, and a collector;

a first load connected between the collector of said first transistor and said second power supply terminal;

direct current (DC) feedback loop means, connected to said input terminal, for feeding back an output signal of said amplifier circuit to said input terminal;

a current generating circuit for generating a first current in proportion to a regulation voltage independent of a voltage at said second power supply terminal;

a first current mirror circuit having a first input transistor connected to said current generating circuit and a first output transistor, a second load connected to said second power supply terminal;

a second transistor connected to said second load and having a base for receiving a voltage equivalent to said regulation voltage;

a second current mirror circuit having a second input transistor connected to said first output transistor and a second output transistor connected to said second transistor; and a third current mirror circuit having a third input transistor connected to said second transistor and a third output transistor connected to said second load.

* * * * *